(12) United States Patent
Tucker et al.

(10) Patent No.: US 9,947,609 B2
(45) Date of Patent: Apr. 17, 2018

(54) INTEGRATED CIRCUIT STACK (75) Inventors: James L. Tucker, Clearwater, FL (US);
Gary Roosevelt, Clearwater, FL (US);
Kenneth H. Heffner, Largo, FL (US);
James Hobbs, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 1012 days.

(21) Appl. No.: 13/416,404

(22) Filed: Mar. 9, 2012

(65) Prior Publication Data

US 2013/0235544 A1 Sep. 12, 2013

(51) Int. Cl.
*H01L 23/48* (2006.01)
*H01L 23/58* (2006.01)
*H01L 23/498* (2006.01)

(52) U.S. Cl.
CPC ...... *H01L 23/481* (2013.01); *H01L 23/49833* (2013.01); *H01L 23/585* (2013.01); *H01L 2224/16225* (2013.01); *H01L 2224/73253* (2013.01); *H01L 2924/1461* (2013.01); *H01L 2924/15192* (2013.01); *H01L 2924/15311* (2013.01); *Y10T 29/49126* (2015.01)

(58) Field of Classification Search
CPC ....... G08B 13/00; G08B 21/00; H01L 21/304; H01L 23/48; H01L 23/02
USPC .......................................... 361/718, 764, 766
See application file for complete search history.

(56) References Cited

U.S. PATENT DOCUMENTS

| | | | |
|---|---|---|---|
| 5,579,207 A * | 11/1996 | Hayden | H01L 25/0657 174/261 |
| 5,657,537 A | 8/1997 | Sala et al. | |
| 6,319,740 B1 * | 11/2001 | Heffner | H01L 21/56 257/E21.502 |
| 6,916,719 B1 | 7/2005 | Knight et al. | |
| 7,253,512 B2 | 8/2007 | Powell | |
| 7,260,890 B2 | 8/2007 | White et al. | |
| 7,439,840 B2 | 10/2008 | Carastro et al. | |
| 7,701,244 B2 | 4/2010 | Bartley et al. | |
| 7,709,943 B2 | 5/2010 | Michaels et al. | |

(Continued)

OTHER PUBLICATIONS

Lau et al., "Feasibility Study of a 3D IC Integration System-in-Packaging (SiP) from a 300mm Multi-Project Wafer (MPW)", 44th International Symposium on Microelectronics, Oct. 9-13, 2011, 9 pages.

(Continued)

*Primary Examiner* — Zachary M Pape
*Assistant Examiner* — Douglas Burtner
(74) *Attorney, Agent, or Firm* — Shumaker & Sieffert, P.A.

(57) ABSTRACT

In some examples, an integrated circuit system includes a plurality of integrated circuit layers. At least one of the integrated circuit layers includes an integrated circuit die, which may not include any through-silicon vias that provide a pathway to an adjacent integrated circuit layer, and an interposer portion, which includes electrically conductive through-vias. The interposer portion may facilitate communication of the integrated circuit die with other integrated circuit layers of the integrated circuit system. In some examples, the stacked integrated circuit system may include more than one integrated circuit die, which may be in the same integrated circuit layer as at least one other integrated circuit die, or may be in a different integrated circuit layer.

19 Claims, 6 Drawing Sheets

(56) References Cited

U.S. PATENT DOCUMENTS

| | | | |
|---|---|---|---|
| 7,730,613 B2 | 6/2010 | Vasoya | |
| 7,884,625 B2 | 2/2011 | Bartley et al. | |
| 7,952,478 B2 | 5/2011 | Bartley et al. | |
| 7,989,918 B2 | 8/2011 | Bartley et al. | |
| 8,183,087 B2 * | 5/2012 | Lin | H01L 21/565 |
| | | | 257/E21.008 |
| 8,208,279 B2 | 6/2012 | Lue | |
| 8,431,828 B2 | 4/2013 | Vanfleteren et al. | |
| 8,461,464 B2 | 6/2013 | Nakamura | |
| 8,716,873 B2 * | 5/2014 | Wang | H01L 21/4832 |
| | | | 257/690 |
| 8,749,337 B2 | 6/2014 | Baram et al. | |
| 8,778,124 B2 | 7/2014 | Rendek, Jr. et al. | |
| 8,824,159 B2 | 9/2014 | Leedy | |
| 2008/0129501 A1 * | 6/2008 | Tucker | G06F 21/86 |
| | | | 340/550 |
| 2009/0127667 A1 | 5/2009 | Iwata | |
| 2010/0026337 A1 | 2/2010 | Bartley et al. | |
| 2010/0031376 A1 | 2/2010 | Bartley et al. | |
| 2011/0102011 A1 | 5/2011 | Van der Plas et al. | |
| 2011/0119322 A1 | 5/2011 | Li et al. | |
| 2013/0235544 A1 | 9/2013 | Tucker et al. | |
| 2014/0192498 A1 | 7/2014 | Rathbum | |
| 2015/0130082 A1 | 5/2015 | Lu et al. | |
| 2015/0279814 A1 | 10/2015 | Hurwitz et al. | |
| 2015/0348904 A1 | 12/2015 | Huang et al. | |
| 2016/0315055 A1 | 10/2016 | Vogt et al. | |

OTHER PUBLICATIONS

Banijamali et al., "Quality and Reliability of 3D TSV Interposer and Fine Pitch Solder Micro-Bumps for 28nm Technology," 44th International Symposium on Microelectronics, Oct. 9-13, 2011, 4 pages.

Nguyen, "Through Silcon Via Research Project," 9 pages, downloadable from http://web.cecs.pdx.edu/~jmorris/ECE%20414%20 &%20514%20Electronics%20Packaging/Projects/TSVs %20Anbinh%20Nguyen%20report.pdf, downloaded on Feb. 28, 2012.

"Vertical-Die-Stacking-Goes-3D-Without-TSV", downloaded on Sep. 27, 2011, 3 pages, downloadable from http://www.electroiq. com/articles/ap/2010/10/vertical-die-stacking-goes.

* cited by examiner

INTEGRATED CIRCUIT STACK

TECHNICAL FIELD

The disclosure relates to stacked integrated circuits.

BACKGROUND

In some examples, integrated circuit components may be vertically stacked to facilitate efficient use of space. In some examples, the stacked integrated circuit components may be packaged in a single package, and electrically coupled to a printed board.

SUMMARY

In general, the disclosure is directed to integrated circuit systems that include multiple stacked integrated circuit layers and one or more integrated circuit die (e.g., one or more application-specific integrated circuit die), and to techniques for forming such integrated circuit systems. The integrated circuit layers are each configured to facilitate encapsulation of the one or more integrated circuit die, thereby defining a secure integrated circuit stack. Encapsulating one or more integrated circuit die within the stack may help protect the integrated circuit system from tampering, e.g., attempted reverse engineering, by hindering access to the integrated circuit die and elements transmitting electrical signals to and from the integrated circuit die within the stack. One of the integrated circuit layers of the stack may include an interposer portion, which includes electrically conductive through-vias extending through the layer in a direction in which the integrated circuit layers are stacked, and an integrated circuit die, which may not include through-vias. In some examples, the interposer portion may include resistive, capacitive, and inductive elements configured to condition electrical signals transmitted to and from the integrated circuit die within the stack.

An electrical contact positioned on a surface of the integrated circuit die may be electrically coupled to an electrical contact positioned on an adjacent integrated circuit layer of the stack, and the integrated circuit die may be electrically connected to other layers of the stack through interconnect elements, e.g., electrically conductive traces, electrically conductive vias, or both, of the adjacent layer and the interposer portion. For example, the integrated circuit stack may include a plurality of integrated circuit dice in the same layer (e.g., arranged in the same plane), and at least one of the integrated circuit die may be electrically connected to another integrated circuit die via an adjacent integrated circuit layer and the through silicon vias of the interposer portion.

In some examples, one or more integrated circuit layers of the system may be configured to act as a sensor layer that may be used to detect physical tampering with the system.

In one example, the disclosure is directed to a system that includes a first integrated circuit layer comprising a first plurality of interconnect elements; a second integrated circuit layer comprising a second plurality of interconnect elements; and a third integrated circuit layer positioned between the first and second integrated circuit layers, wherein the first, second, and third integrated circuit layers are stacked in a z-axis direction. The third integrated circuit layer comprises an interposer portion comprising an electrically conductive through-via, wherein the electrically conductive through-via is configured to communicate with at least one interconnect element of the first plurality of interconnect elements and at least one interconnect element of the second plurality of interconnect elements, and an integrated circuit die adjacent to the interposer portion and between the first and second integrated circuit layers, wherein a surface of the integrated circuit die comprises an electrical contact electrically connected to the second integrated circuit layer, wherein the electrically conductive through-via of the interposer portion electrically connects the integrated circuit die with the first integrated circuit layer.

In another example, the disclosure is directed to a method that includes stacking a first integrated circuit layer, a second integrated circuit layer, and a third integrated circuit layer in a z-axis direction, wherein the first integrated circuit layer comprises a first plurality of interconnect elements, the second integrated circuit layer comprises a second plurality of interconnect elements, and the third integrated circuit layer comprises an interposer portion comprising an electrically conductive through-via configured to communicate with at least one interconnect element of the first plurality of interconnect elements and at least one interconnect element of the second plurality of interconnect elements, and an integrated circuit die adjacent to the interposer portion and between the first and second integrated circuit layers, wherein a surface of the integrated circuit die comprises an electrical contact. The method further includes electrically connecting the electrical contact of the integrated circuit die to the second integrated circuit layer, wherein, when the electrical contact of the integrated circuit die is electrically connected to the second integrated circuit layer, the electrically conductive through-via of the interposer portion electrically connects the integrated circuit die with the first integrated circuit layer.

The details of one or more examples are set forth in the accompanying drawings and the description below. Other features, objects, and advantages of the disclosure will be apparent from the description and drawings, and from the claims.

DETAILED DESCRIPTION

An example stacked integrated circuit (IC) system described herein includes a plurality of IC layers, at least one of which includes an interposer portion and an IC die that is configured to communicate with other IC layers through electrically conductive vias of the interposer portion. A layer may define a substantially planar surface (e.g., planar or nearly planar but for minor processing variations) in some examples. The electrically conductive vias may route signals in substantially the same direction (e.g., generally the same or the same) as the direction in which the IC layers are stacked (referred to herein as a z-axis direction for ease of description). In some examples, the electrically conductive vias may extend in substantially the same direction (e.g., generally the same or the same) as the direction in which the IC layers are stacked. The electrically conductive vias of the interposer portion include through-vias (e.g., through-silicon vias) that extend through an entire thickness (measured in the z-axis direction) of the IC layer in which the interposer portion is positioned. A through-via may provide front-side to back-side connections. For example, a through-via may electrically connect electrically conductive pads on the back of the IC die to a bottom metal layer on a front of the die, such that metal layer and vias may then used to complete the connection to the top of the IC die.

In some examples, an IC die of the system may be electrically coupled (e.g., via one or more electrical contacts) to an adjacent IC layer, which may be electrically connected to an interposer portion via respective electrically conductive vias. The interposer portion may be in the same layer as the IC die in some examples. The through-vias of the interposer portion provide z-axis electrically conductive pathways through which the adjacent IC layer can communicate with other IC layers of the stack. For example, the interposer portion may be in electrical communication with electrically conductive vias of another adjacent IC layer (e.g., on the other side of the IC die), which may be in electrical communication with electrically conductive vias of a fourth IC layer, and so on. In this way, the interposer portion may facilitate communication between the IC die and other IC layers of the stack, other IC die of the stack (to the extent the stack includes multiple die), or both, even if the IC die itself does not include through-vias or through-vias that provide a pathway to an adjacent IC layer of the stack.

In some examples, the IC layer that includes the IC die may be positioned between two IC layers. Together, these adjacent IC layers and the interposer portion, which at least partially surrounds the IC die, may define a secure boundary for the IC die that helps inhibit access to the IC die.

The stacked IC systems described herein may provide one or more advantages. For example, in examples in which the IC die includes proprietary or sensitive information or configurations, positioning the IC die within the stack of IC layers and proximate an interposer portion may provide increased security and prevent or reduce the risk of reverse engineering of the IC stack. The surrounding IC layers and interposer portion may hinder physical access to the IC die. In addition, critical interconnects between an IC die and the other IC layers, IC dice, or both, may also be secured within the inner layers of the stacked IC system, which may further inhibit access to information that may be useful for reverse engineering the IC system. For example, an adversary may have more difficulty sampling the power consumption of an IC die when the electrical interconnects between an IC die and other components (e.g., an off-chip memory provided by another IC die of the system) are secured within the inner layers of the stacked IC system and not exposed. Power consumption may be one parameter used by an adversary to gain information about the IC system in a type of attack referred to as a side channel attack.

The one or more IC layers of the system may have additional characteristics that add to the robustness of the security of the IC system. In some examples, one or more IC layers of the system may include tamper detection properties (e.g., chemical, resistive, inductive, capacitive tamper-detection components) with which tampering with the IC stack may be detected. In addition, or instead, one or more IC layers of the system may be configured to provide radiofrequency (RF) or electromagnetic interference (EMI) shielding of the IC die.

The stacked IC systems described herein may facilitate incorporation of IC die that conventionally may not be used in stacked IC assemblies because they do not include through-vias, e.g., third party or off-the-shelf IC components. In this way, the stacked IC systems described herein may facilitate manufacturing of more application-specific assemblies because, in some examples, an IC die may be incorporated into the assemblies without requiring substantial or any reconfiguration or customization of the configuration of the IC die (e.g., the addition of certain types of electrical interconnects, such as through-vias).

Figure 1:
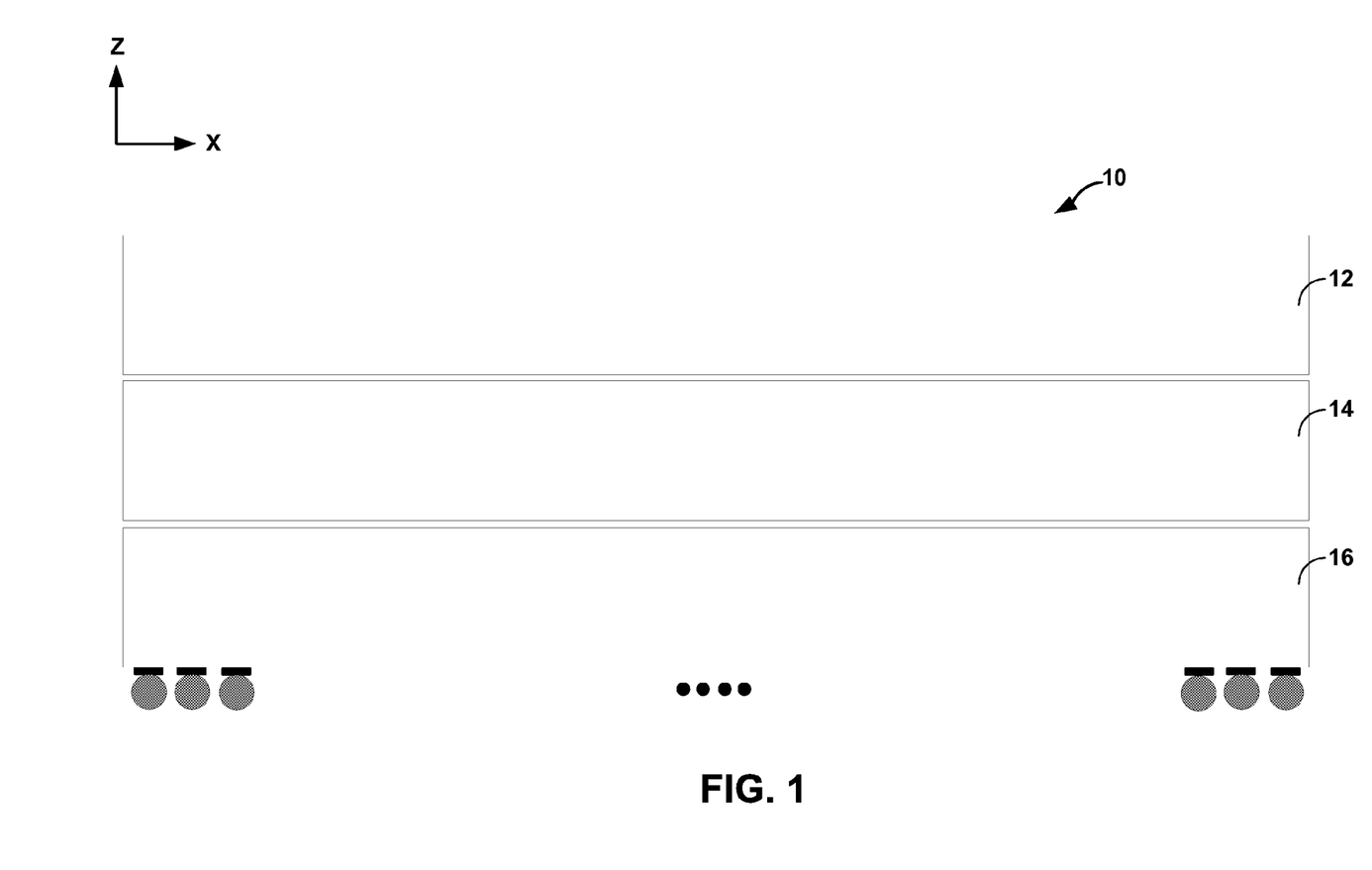
FIG. 1 is a schematic cross-sectional diagram of an integrated circuit system which includes vertically-stacked integrated circuit layers.

FIG. 1 is a schematic cross-sectional diagram of an example IC system 10 which includes vertically-stacked IC layers 12, 14, and 16. As shown in FIG. 1, IC layers 12, 14, 16 are stacked, e.g., arranged, in the z-axis direction, (orthogonal x-z axes are shown in FIG. 1 (as well as the other figures), for ease of description), such that when IC layers 12, 14, 16 are planar, each layer 12, 14, 16 is in a separate plane. In the example shown in FIG. 1, each IC layer 12, 14, and 16 has the same dimension and configuration (e.g., shape). In other examples, however, layers 12, 14, 16 may have different sizes, such that the layers are stacked, but at least two layers are partially offset from each other due to the different configurations or dimensions.

In some examples, vertically stacking IC layers adjacent to the layer that include the IC die prior to mechanically coupling the IC layers to a printed board may save space, in comparison to examples in which separate IC components are aligned in a planar configuration on the printed board.

The examples described herein include systems of vertically stacked IC layers that substantially encapsulate (e.g., fully encapsulate or nearly fully encapsulate) one or more IC die within the stack, such that the IC dice of the system are relatively difficult to access. In addition, in some examples, a stacked IC system includes one or more tamper sensors that are each configured to generate data indicative of tampering with the IC stack, based on which some responsive action may be taken to help prevent unauthorized access to the IC dice (as discussed in further detail below). These tamper protection measures may be useful if, for example, an IC die of the system store sensitive, proprietary or confidential information or software, such as classified information or software to which access is restricted by law or regulation to particular groups of persons or other intellectual property of an individual or entity. The tamper protection measures may also be useful if, for example, the IC system or has a configuration or other characteristic that is sensitive, proprietary, or confidential. In this way, the systems described herein may provide increased security, in comparison to systems with other configurations.

Figure 2:
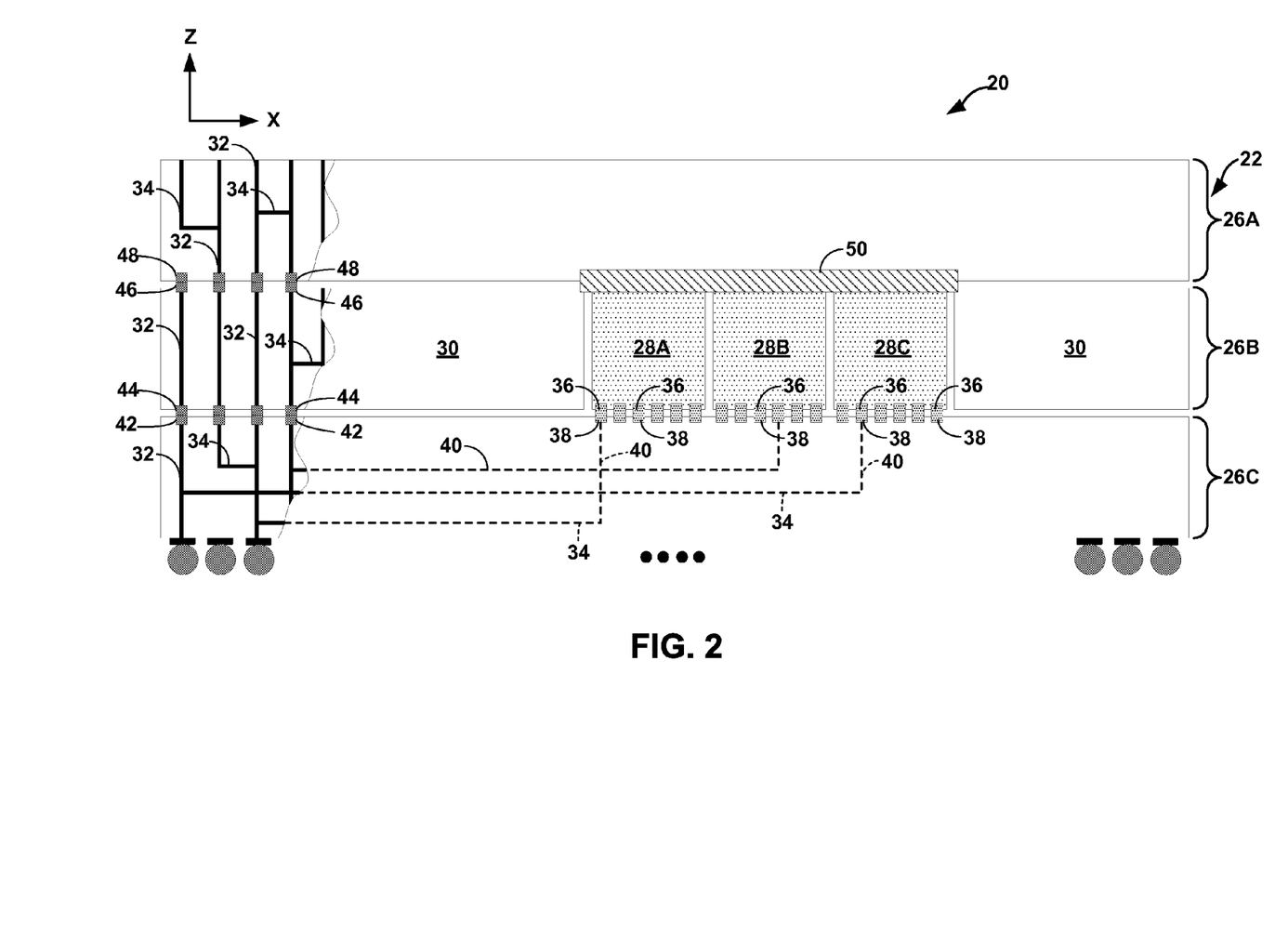
FIG. 2 is a schematic cross-sectional diagram of a vertically-stacked integrated circuit system including three integrated circuit layers, one of which includes an interposer portion and three integrated circuit die.
Figure 3:
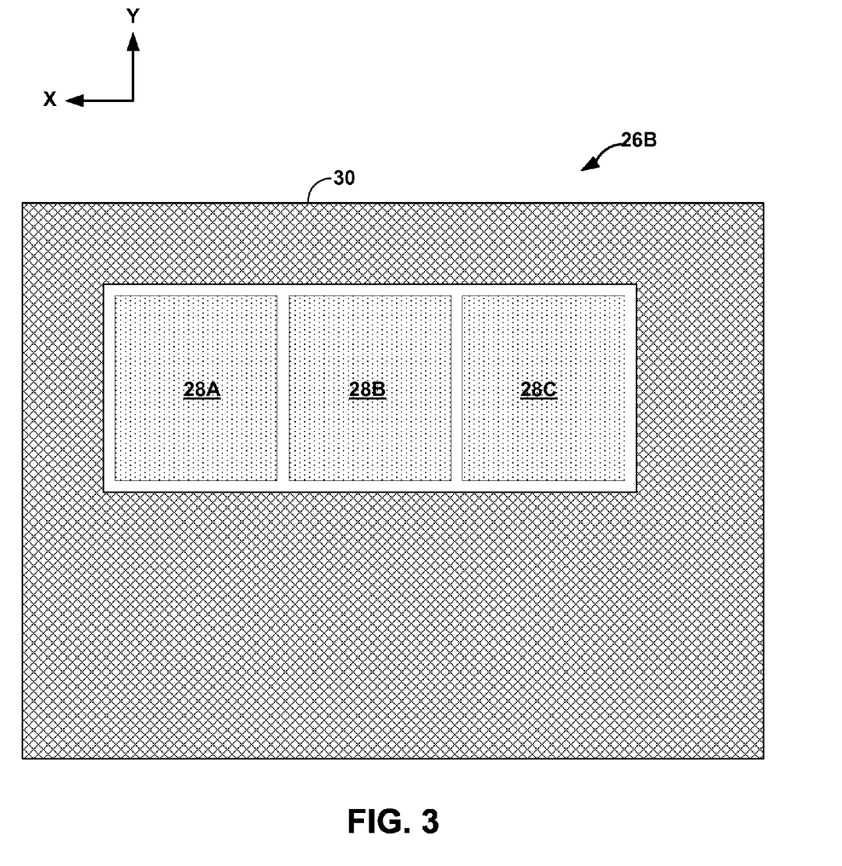
FIG. 3 is a schematic diagram illustrating a top view of the interposer portion and three integrated circuit die of FIG. 2.

FIG. 2 is a schematic cross-sectional diagram of z-axis stacked IC system 20 formed from IC layers 26A, 26B, and 26C. IC system 20 is an example of IC system 10 of FIG. 1. IC layers 26A-26C collectively define IC stack 22. In the example illustrated in FIG. 2, layer 26B (which is positioned between layers 26A and 26C) includes three IC die 28A, 28B, and 28C and interposer portion 30, which substantially surrounds (e.g., completely or nearly completely surrounds in a cross-section taken along a plane orthogonal to the z-axis) IC die 28A-28C (as also illustrated in FIG. 3). In this way, IC layer 26A, interposer portion 30, and IC layer 26C encapsulate IC die 28A-28C within the system 20, such that die 28A-28C are not exposed. For example, in some examples, when IC die 28A-28C are encapsulated by IC layers 26A, 26C and interposer portion 30, IC die 28A-28C are not visibly exposed (to the human eye) such that an intruder cannot visually ascertain where IC die 28A-28C are located within the IC layer stack 22, what types of IC die 28A-28C are included in system 22, or the configuration of the electrical connections between the die 28A-28C without further physical tampering with system 20 to expose IC die 28A-28C. In some examples, encapsulating the IC die 28A-28C within stack 22 may help minimize or even prevent interception of electrical signals (during a tamper event) transmitted by the IC die within the stack 22, which could provide insight into the components and capabilities of system 20, e.g., to a reverse engineer.

IC layers 26A, 26C and interposer portion 30 of IC layer 26B are configured to electrically connect each IC die 28A-28C to at least one other IC die 28A-28C, such as by routing signals between two or more IC die 28A-28C. In the example illustrated in FIG. 2, each of IC layer 26A, IC layer 26C, and interposer portion 30 of IC layer 26B includes electrically conductive vias 32, which are configured to route signals in a direction generally in the z-axis direction (orthogonal x- and z-axes are shown for purposes of illustration), and electrically conductive traces 34, which are configured to route signals in other directions, such as in directions generally along the x-y plane. Electrical signals can be transmitted within the respective layer through the electrically conductive traces 34.

At least some of electrically conductive vias 32 extend substantially through the entire thickness of the IC layer 26A, 26B or interposer portion 30 (where the thickness is measured in the z-axis direction), such that these electrically conductive vias 32 define through-vias that provide a front-side to back-side electrical connection. Through-vias may also be referred to as "through-silicon vias" in examples in which IC layer 26A, IC layer 26C, and interposer portion 30 are formed from a wafer including a silicon substrate. The through-vias define z-axis electrical interconnects of IC system 20.

In some examples, although not shown in FIG. 2, a surface of the IC die 28A-28C adjacent to IC layer 26A may also include electrical contacts or pads. In these examples, traces 34, and/or other interconnect elements, within IC layer 26A may facilitate electrical connection and communication (e.g., via through-vias 32 of interposer portion 30) between top and bottom surfaces of the IC die 28A-28C. In this way, IC die 28A-28C may include input and output for electrical signals on multiple sides of the die while not requiring vias extending substantially therethrough.

The configuration of electrically conductive vias 32 and traces 34 shown in FIG. 2 is merely one example; in other examples, systems in accordance with the disclosure may have any configuration of electrically conductive vias and traces suitable for facilitating electrical communication within layers of the stack and between layers of the stack. However, as discussed in further detail below, the IC die 28A-28C of system 20 may not include through-vias, e.g., through-vias electrically connected to IC layer 26A, in some examples.

In some examples, IC layer 26A and IC layer 26C may be custom IC layers, e.g., custom semiconductor devices. For example, IC layer 26A and IC layer 26C may be selected or formed to have a particular function based on the application for which system 20 is intended. In some examples, IC layer 26A and/or IC layer 26C may be formed with particular thermal properties such that the layers may help dissipate heat generated by components of system 20, such as IC die 28A-28C. As another example, IC layer 26A and/or IC layer 26C may be configured to help shield IC die 28A-28C from EMI (e.g., radio frequency interference). As yet another example, IC layer 26A and/or IC layer 26C may include one or more termination resistors that may prevent reflection of electrical signals that may cause interference. Although several examples are described, IC layers 26A and 26C may be formed with any properties suitable for the particular application for which system 20 is intended. For example, in some examples, IC layers 26A and 26C may include an analog interposer chip, a microelectromechanical system (MEMS), an inertial sensor, a magnetic sensor, an electromagnetic sensor, a chemical sensor, a biological sensor, an acoustic sensor, an optical sensor, a radiation sensor, a radio-frequency (RF) link, a power resource, dynamic random access memory (DRAM), a field programmable gate array (FPGA), a parallel computing resource, or any combination thereof.

As illustrated in FIG. 2, IC layers 26A and 26C include a plurality of electrically conductive pathways, e.g., vias 32 and traces 34, extending within the layers. Vias 32 and traces 34 are configured to transmit electrical signals within the layers, and vias 32 that are through-vias are configured to transmit electrical signals between adjacent IC layers. The electrically conductive vias and traces may be defined by any suitable electrically conductive material, such as tungsten, molybdenum, copper, aluminum, silver, or gold.

IC layers 26A and 26C, including electrically conductive vias extending therethrough and within, may be formed using any suitable technique. For example, IC layers 26A and 26C may be formed using any suitable semiconductor processing technique. The semiconductor processing may be used to define the electrically conductive vias 32 and electrically conductive traces 34 in IC layers 26A and 26C within a semiconductor material (e.g., silicon). In addition, in examples in which IC layers 26C, 26C include semiconductor components, such as transistors in silicon, the components may be formed using the semiconductor processing techniques (e.g., as part of front-end-of-line (FEOL) processing).

In some examples, vias 32 and traces 34 are formed as part of the back end-of-line (BEOL) processing part of an IC fabrication step. For example, a plurality of metal layers may be deposited onto a substrate (e.g., an active semiconductor layer) using planar copper dual damascene interconnect technology, tungsten polished local interconnect technology, or planarized subtractive aluminum interconnect technology, or some combination of these techniques. Each metal layer may be patterned and etched to define the electrically conductive traces 34 of a particular plane of the IC layer 26A, 26C. After patterning and etching a metal layer, an electrical isolation material, such as a dielectric layer, may be deposited prior to depositing another metal layer, such that the electrical isolation material may electrically isolate the electrically conductive traces 34 (and vias 32) from each other. This may be repeated for each sub-layer of IC layer 26A, 26C including traces 34. To define electrically conductive vias 32, holes may be etched through the dielectric and, in some cases, through the metal layers (in the case of vias 32 that electrically connect traces 34) and the substrate (in the case of through-vias), and then the holes may be filled with an electrically conductive material (e.g., tungsten, molybdenum, copper, silver, or gold) using any suitable technique such as chemical vapor deposition (CVD). In the case of through-vias, an oxide or dielectric layer may be used to isolate the through-vias from the substrate and from one another. In other examples, other techniques may be used to form IC layers 26A and 26C.

In some examples, passive elements configured to condition electrical signals within the stack may be positioned within IC layers 26A and 26C during fabrication. For example, IC layers 26A and 26C may be formed to include one or more passive resistors, inductors, capacitors, or any combination thereof, which are configured to manipulate signals such that the signals are satisfactory for a subsequent stage of processing. As an example, resistive elements within IC layers 26A and 26C may be used to pull unused logic circuit inputs to particular states and to achieve particular impedance effects.

As described herein, IC layers 26A and 26C and interposer portion 30 include interconnect elements configured to transmit electrical signals through stack 22 in order to provide electrical communication between IC layers 26A, 26B, and 26C. Although the examples illustrated herein portray IC layers 26A and 26C (e.g., IC layers that do not include IC die 28A-28C) as including through-vias 32 extending substantially through the respective IC layers, in some examples, IC layers 26A and/or 26C may not include through-vias 32. Instead, IC layers 26A and 26C may include other interconnect elements configured to transmit, condition, and/or process electrical signals within the respective IC layer, and to provide communication between IC die 28A-28C and IC layer 26A.

Interconnect elements may include any electrically conductive elements which facilitate communication between IC die 28A-28C and other IC layers of stack 22, e.g., IC layer 26A. In the examples described herein, IC layers 26A, 26C and interposer portion 30 include interconnect elements. Interconnect elements of IC layers 26A, 26C and/or interposer portion 30 may include, for example, through-vias 32, traces 34, passive circuit elements (e.g., passive resistors, inductors, and capacitors), active circuit elements, metal layers, logic circuits, or other conductive elements positioned within IC layers 26A, 26C and/or interposer portion 30.

Interposer portion 30 of IC layer 26B may, in some examples, be substantially similar to IC layers 26A and 26C. For example, as illustrated in FIG. 2, interposer portion 30 includes electrically conductive vias, e.g., vias 32 and electrically conductive traces 34, extending there through. Vias 32 and traces 34 provide electrical interconnects that may be used to transmit electrical signals between layers 26A, 26B, and 26C and between IC die 28A-28C. In this way, interposer portion 30 may provide interconnection circuitry for system 20. In some examples, interposer portion 30 may solely be configured as a pathway for electrical signals while, in other examples, interposer portion 30 may include additional capabilities, such as those described above with respect to IC layers 26A and 26C. In some examples, interposer portion 30 may be formed using the techniques described above with respect to IC layers 26A, 26C.

In some examples, after electrically conductive vias and layer-to-layer bonds are formed within the stack, IC layers 26A, 26C, and interposer portion 30 may be thinned by removing some of the silicon wafer material from the layers, thereby leaving a relatively thin circuitry layer that may be used for signal routing. In this way, the IC layers 26A, 26C, and interposer portion 30 may be thinned down to active metal and semiconductor components. Thinning of the semiconductor layers may save space, e.g., by providing thinner layers, and may increase thermal conduction through the stack because a relatively larger portion of the stack is formed from conductive materials.

In the example illustrated in FIG. 2, interposer portion 30 is formed as a component of layer 26B separate from layers 26A and 26C. However, in other examples, interposer portion 30 may be formed integrally with at least one of IC layers 26A or 26C. In these examples, interposer portion 30 may be formed to extend from one of IC layers 26A or 26C in a z-axis direction, and may define a void configured to receive the IC die 28A-28C. In some examples, a particular integrated circuit layer may include a plurality of integrated circuit die, and interposer portion 30 may be formed and configured to substantially fill voids between the plurality of integrated circuit die, such that the integrated circuit layer may have a planar configuration suitable for stacking.

IC die 28A-28C are positioned in a common plane in the example shown in FIG. 2. IC die 28A-28C may be configured for various signal processing tasks, which may be specific to the application for which IC system 20 is used. Accordingly, the type of IC die 28A-28C included in system 20 may vary in different examples. For example, any of IC die 28A-28C may include die configured for one or more of processing (e.g., co-processor or microprocessor die), memory (e.g., random access memory (RAM) or non-volatile memory (NVM)), power conditioning, ambient monitoring (e.g., temperature and/or health monitoring), sensing, encryption, optics-photonics, or non-volatile memory. As additional examples, any of IC die 28A-28C may include radio-frequency integrated circuit devices, radiation-hardened devices, microelectromechanical systems (MEMS), or any combination thereof. Particular types of IC die may be selected for incorporation into system 20 based on the particular application for which system 20 is designated. For example, some applications may require more processing IC die, while other applications may require more memory IC die.

In some examples, IC die 28A-28C may include any IC die that are not inherently configured for vertical stacking, e.g., that do not include through-vias extending completely through the thickness of the die (measured in the z-axis direction in the example shown in FIG. 2). In this way, the IC die 28A-28C need not be custom made to be incorporated into system 20 and, instead, may be selectively incorporated based on a particular application for which system 20 is intended. In some examples, the IC die 28A-28C may be third party IC die which, in some examples, may be processed to enhance planarity for stacking and die thickness uniformity, and/or to add a metal layer to facilitate electrical connection to IC layer 26A, IC layer 26C, or interposer portion 30. In some examples, the third party IC die may be procured in wafer form and subsequently processed for incorporation into system 20.

Electrically conductive vias 32 of interposer portion 30 that are through-vias add z-axis electrically conductive pathways to system 20 that may ordinarily be provided by through-vias of IC die 28A-28C. Thus, while IC die 28A-28C may include through-vias, IC die 28A-28C need not include through-vias in order to electrically connect to at least one other die and to be incorporated into system 20 that includes a z-axis stacked configuration.

IC die 28A-28C are each configured to electrically connect to at least one adjacent IC layer 26A, 26C. Routing between an IC die 28A-28C and another IC die or may then be provided by electrically conductive pathways through the adjacent IC layer to which the IC is electrically connected, and, in some examples, also through electrically conductive pathways of interposer portion 30, and the other IC layer.

Routing between an IC die 28A-28C and the other IC layer may be provided by electrically conductive pathways through the adjacent IC layer to which the IC is electrically connected, through interposer portion 30, and the other IC layer.

In the example illustrated in FIG. 2, IC die 28A-28C include electrical contacts 36 positioned on a surface of the respective IC die and configured to be electrically coupled to electrical contacts 38 positioned on a surface of IC layer 26C. (In FIG. 2, only some of electrical contacts 36 and 38 are denoted, for clarity of illustration.) As illustrated, at least some of electrical contacts 38 of IC layer 26C are electrically coupled to electrically conductive vias 40 (illustrated by hidden lines in FIG. 2), which are electrically coupled to respective electrically conductive traces 34. Electrically conductive traces 34 each electrically connect electrically conductive vias 40 to through-silicon vias 32, which electrically connect to respective through-silicon vias 32 of interposer portion 30. As shown in FIG. 2, through-silicon vias 32 of interposer portion 30 are electrically connected to electrically conductive vias 32 within IC layer 26A. In this way, IC die 28A-28C may communicate with IC layers 26A and 26C stacked on either side of the die 28A-28C, even though the IC die themselves may not include through-silicon vias. In addition, interposer portion 30 further provides an electrically conductive pathway (e.g., through-silicon vias 32) through which IC die 28A-28C may communicate with multiple layers of the IC stack 22 of system 20.

Although the figures described herein include through-silicon vias 32 extending through IC layers 26A and 26C, in some examples, only interposer portion 30 includes through-silicon vias 32. That is, in some examples, while interposer portion 30 may include through-silicon vias 32, IC layers 26A and 26C may not include through-silicon vias 32 extending substantially through the layers. In other examples, one of IC layers 26A or 26C may include through-silicon vias 32, while the other does not. In these examples, IC layers 26A and/or 26C may include metal layers and vias 34 (and not through-vias 32) configured to route electrical signals from IC die 28A-28C to IC layer 26C.

In the particular example illustrated in FIG. 2, electrical contacts on each of IC layers 28A, 28C and interposer portion 30 are used to electrically connect layers 28A, 28C with interposer portion 30. For example, some of the electrically conductive vias 32 of IC 26 are electrically coupled to electrical contacts 42, positioned on a surface of IC layer 26C proximate to IC layer 26B. In this example configuration, electrical contacts 42 are configured to be coupled to electrical contacts 44, which are positioned on a surface of interposer portion 30 of IC layer 26B, and are electrically coupled to electrically conductive vias 32 within interposer portion 30.

In the example illustrated in FIG. 2, interposer portion 30 also includes electrical contacts 46 positioned on a surface of interposer portion 30 proximate to IC layer 26A, where contacts 46 are electrically coupled to at least some of the electrically conductive vias 32 of interposer portion 30. Electrical contacts 46 of interposer portion 30 are electrically coupled to electrical contacts 48 positioned on a surface of IC layer 26A proximate to interposer portion 30. As illustrated, at least some of electrical contacts 48 are electrically coupled to electrically conductive vias 32 of IC layer 26A. Thus, in the example illustrated in FIG. 2, electrically conductive vias 32 of IC layer 26C, through-silicon vias 32 of interposer portion 30, and IC layer 26A, in combination with electrical contacts 36, 38, 42, 44, 46, and 48, form a pathway for transmission of electrical signals between IC die 28A-28C and other layers of the system 20. Although FIG. 2 illustrates through-vias 32 extending through IC layers 26A and 26C as well as interposer portion 30, in some examples IC layers 26A and/or 26C may not include through vias-32 extending substantially completely through the respective IC layer.

Adjacent electrical contacts of system 20 may be coupled to one another using any suitable technique. For example, in some examples, adjacent electrical contacts (such as contacts 36 and 38, contacts 42 and 44, contacts 46 and 48, etc.) may be bonded to one another utilizing a direct metal bonding technique. For example, in some examples, contacts 36, 38, 42, 44, 46, and 48 may be formed from copper or another suitable metal. In these examples, the copper may be treated by receding any dielectric material surrounding the copper or by deposition of additional copper via a maskant. Subsequently, adjacent contacts (e.g., contacts 36 and 38, contacts 42 and 44, contacts 46 and 48, etc.) may be aligned and bonded to one another using thermal compression bonding, or an oxide bonding technique.

As illustrated in FIG. 2, each of IC die 28A-28C includes electrical contacts positioned on a first side of the respective IC die and configured to electrically couple the IC die to other layers of the system 20. In some examples, the IC die 28A-28C may also be mechanically coupled via an additional coupling mechanism to one or more adjacent IC layers of stack 22. This may help further fix the position of IC die 28A-28C within system 20, e.g., fix the position of IC die 28A-28C relative to interposer portion 30, an adjacent IC layer 28A, 28C, or both.

In the example illustrated in FIG. 2, each of IC die 28A-28C is mechanically coupled to IC layer 26A via adhesive bond 50 positioned on a surface of the respective IC die 28A-28C opposite the electrical contacts 36. Adhesive bond 50 may be, for example, positioned on a silicon substrate side of IC dice 28A-28C in examples in which IC dice 28A-28C are fabricated from a silicon wafer. Adhesive bond 50 may comprise any suitable adhesive material configured to mechanically coupled IC die 28A-28C to one or more adjacent layers of stack 22. For example, adhesive bond 50 may comprise a SU-8 adhesive, a benzocyclobutene adhesive, or another adhesive that utilizes free-radical, non-condensation-based organic reactions (e.g., an adhesive that does not include ions, water, alcohols or corrosives). In some examples, adhesive bond 50 may be positioned on an additional or alternative surface of the IC die 28A-28C. Adhesive bond 50 may be applied to IC die 28A-28C using any suitable adhesive bonding technique. Although an adhesive bond 50 is described herein, in other examples, system 20 may include another type of wafer bond to mechanically couple IC die 28A-28C to adjacent layers of stack 22. For example, in some examples, thermal compression bonding (e.g., copper-to-copper thermal compression bonding or oxide bonding) may be utilized to mechanically couple IC die 28A-28C to adjacent layers of stack 22.

Although the IC systems described herein include three IC layers, one of which includes one interposer portion and three IC die, systems in accordance with the disclosure may include any number and configuration of IC layers. For example, an examples IC system may include more than three IC layers, e.g., five IC layers, some of which may also include interposer portions and IC die. In some examples, a single IC stack may include more than one IC layer in which IC die are encapsulated. As another example, the IC stacks may include less than three, e.g., one or two, IC die, or more than three IC die encapsulated within the stack.

As yet another example, IC layers 26A and 26C (e.g., layers of the stack that do not include IC die) may comprise multiple sections, instead of being a single, continuous element (as shown in the figures described herein). In these examples, voids may exist between the multiple sections and a suitable fill material may be used to fill the voids in order to form a planar surface for stacking of the layers and to ensure electrical connections from, e.g., an interposer layer or other adjacent layer, to the top layer. In some examples, the layer comprised of multiple sections may be processed to include one or more metals layers and/or one or more shielding layers.

FIG. 3 is a schematic cross-sectional diagram of system 20 and illustrates a top view of IC layer 26B (FIG. 2). As described with respect to FIG. 2, IC layer 26B includes interposer portion 30, which includes electrically conductive vias (e.g., through-vias or vias that only extend partially through the layer), and, in some examples, electrically conductive traces, extending therethrough, and IC die 28A-28C, which may not include through-vias, e.g., through-vias connected to IC layer 26A. In some examples, a thickness of interposer portion 30 may be greater than or equal to a thickness of the thickest IC die 28A-28C.

In the example illustrated in FIG. 3, IC die 28A-28C are aligned in one direction, in an x-axis direction, within IC layer 26B. In other examples, IC die 28A-28C and any additional IC die included in system 20 may be aligned in two directions, e.g., in x-axis and y-axis directions, within IC layer 26B, thereby defining a two-dimensional array of IC dice.

In the example shown in FIGS. 2 and 3, IC die 28A-28C are substantially entirely (e.g., entirely or nearly entirely) surrounded by interposer portion 30 in the x-y plane (x- and y-axes are shown for purposes of illustration). With this configuration, when IC layer 26A and IC layer 26C are positioned above and below (with respect to the z-axis) IC layer 26B, IC die 28A-28C are substantially entirely encapsulated (e.g., entirely encapsulated or nearly entirely encapsulated) within stack 22 and are not exposed, such that access to IC die may be hindered. In this way, adjacent IC layers 26A, 26C and interposer portion 30 define a secure boundary for IC die 28A-28C of system 20 that helps prevent access to IC die 28A-28C.

In other configurations, however, IC die 28A-28C may only be partially encapsulated within stack 22. For example, at least one of IC die 28A-28C may be positioned proximate to an outer perimeter of stack 22 (in contrast to being positioned away from the outer perimeter of stack 22, as illustrated in FIG. 3) such that, when IC layer 26A and IC layer 26C are positioned above and below (with respect to the z-axis) IC layer 26B, at least a portion of the at least one IC die 28A-28C is exposed. In these examples, the IC layers may still define a secure boundary for IC die 28A-28C because the boundary may still be more secure than if interposer portion 30 was not adjacent the IC die.

Other techniques may be used in addition to the secure or partially secure boundary defined by IC layers 26A-26C to protect IC system 20 from reverse engineering. For example, if one of IC die 28A-28C is a memory, the contents of the memory may be encrypted. The secure or partially secure boundary defined by IC layers 26A-26C may be an additional layer of security against unauthorized access to the memory contents.

As discussed above, in some examples, an IC system including an IC layer comprising an interposer portion and at least one IC die may include additional features that provide tamper protection, e.g., by preventing access to the IC die.

Figure 4:
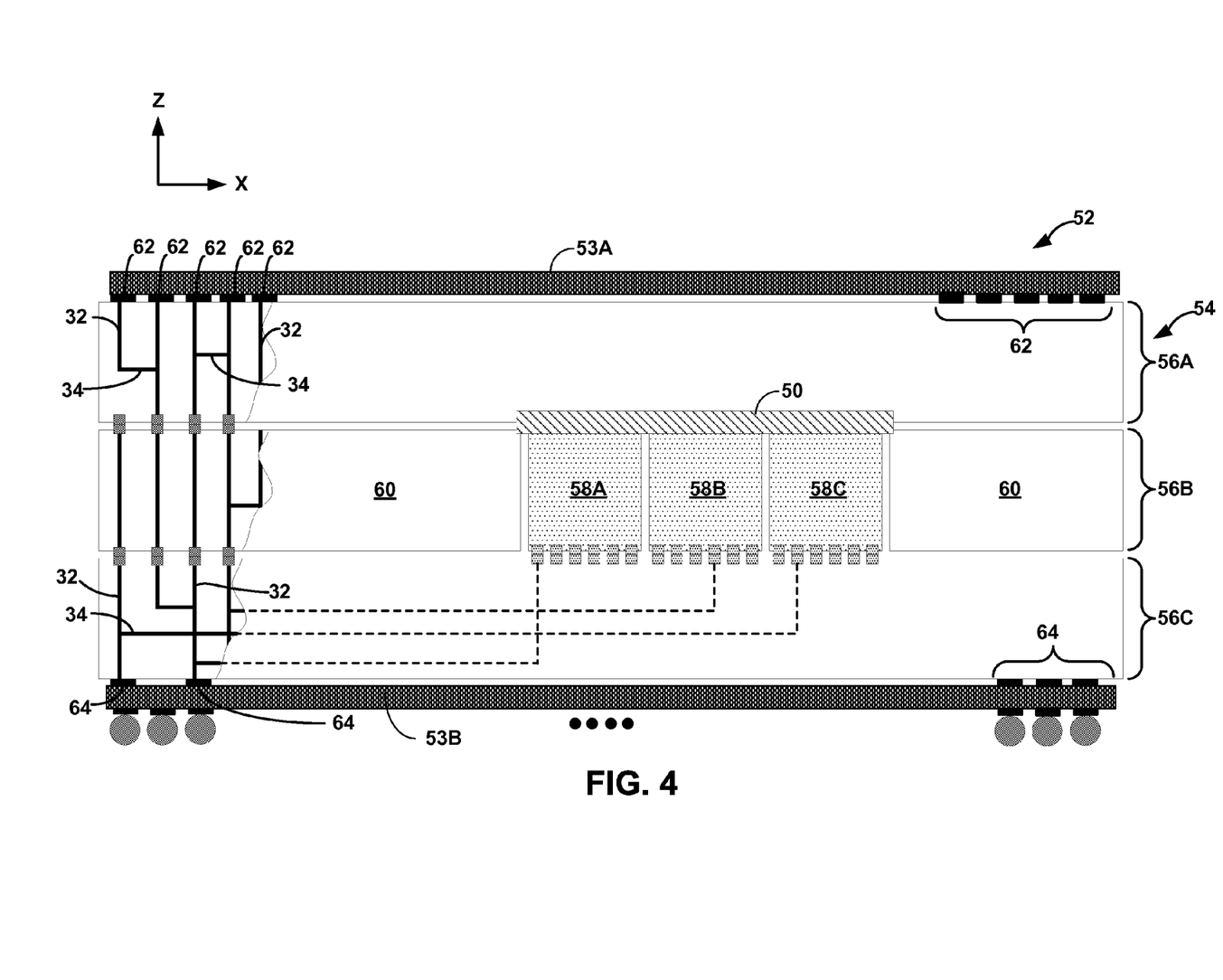
FIG. 4 is a schematic cross-sectional diagram of a vertically-stacked integrated circuit system that includes sensor layers configured to detect tampering.

FIG. 4 illustrates another example IC system 52 that includes sensor layers 53A and 53B configured to detect tampering with system 52. A partial cross-sectional view is shown in FIG. 4, where a part of system 52 has been cut away to illustrate electrically conductive vias 32 and traces 34 (some of which are labeled in FIG. 4), as well as electrical contacts. As illustrated in FIG. 4, system 52 includes IC stack 54 comprising IC layers 56A, 56B, and 56C. IC stack 54 may be substantially similar to IC stack 22 (FIGS. 2 and 3) and IC layers 56A, 56B, and 56C may be substantially similar to IC layers 26A, 26B, and 26C, respectively (FIGS. 2 and 3). As shown in FIG. 4, IC layer 56B includes IC die 58A, 58B, and 58C, which may be substantially similar to IC die 28A, 28B, and 28C (FIGS. 2 and 3), and interposer portion 60, which may be substantially similar to interposer portion 30 (FIGS. 2 and 3).

In the example illustrated in FIG. 4, sensor layers 53A and 53B form distinct layers of IC system 52, e.g., sensor layers 53A and 53B are separate from IC layers 56A-56C of IC system 52. In some examples, sensor layers 53A and 53B may comprise a singular sensor or a plurality of grouped sensors. In some examples, sensor layers 53A and 53B may be positioned between adjacent layers of system 52 or a plurality of grouped interactive sensors deployed between adjacent layers or tiers of the system. In other examples, sensor layers 53A and 53B may be incorporated into one or more of IC layers 56A-56C of IC system 52. For example, sensor layers 53A and/or 53B may be formed integrally with IC layer 56A, IC layer 56C, or interposer portion 60.

As illustrated in FIG. 4, sensor layers 53A and 53B may be electrically coupled to electrically conductive vias 32 extending through IC layers 56A and 56C, respectively. In this way, IC layer 56A, IC layer 56C, interposer portion 60, or IC die 58A-58C may monitor sensor layers 53A and 53B to determine whether a tamper event has occurred, e.g., whether a reverse engineer has attempted to access components of stack 54.

In some examples, sensor layers 53A and 53B may each be thin film sensors configured such that an electrical parameter (e.g., resistance, inductance, or capacitance) or a chemical parameter of the sensor changes in response to tampering with the sensor layers 53A, 53B. A change in the parameter may be correlated to a tamper event. For example, sensor layers 53A and 53B may include one or more strain gauges or stress gauges that are configured to change resistance in response to changes in strain or stress applied to the respective sensor layer 53A and 53B. Thus, a processor of system 52, which may be provided by one or more of the IC die 58A-58C, may monitor a signal indicative of the resistance of one or both sensor layers 53A, 53B and detect a tamper event when a threshold change in resistance or a threshold resistance is detected. The threshold change in resistance or threshold resistance indicative of an attempted tamper event may be stored by a memory of system 52, which may be provided by one or more of the IC die 58A-58C or may be stored by a memory outside of system 52.

As another example, sensor layers 53A and 53B may each include one or more electromagnetic (e.g., optical spectrum) matrices and a processor of system 52 may be configured to detect tampering by sensing changes in one or more properties of light (e.g., a wavelength) traveling through the electromagnetic matrices. As another example, sensor layers 53A and 53B may include chemical sensors, magnetic sensors, acoustic sensors, pressure sensors, vibrations sensors, thermal sensors, particle sensors, and the like. U.S. Patent Application Publication No. 2008/0129501 by Tucker et al., filed on Nov. 30, 2006 and entitled "SECURE CHASSIS WITH INTEGRATED TAMPER DETECTION SENSOR," describes additional types of sensors that may be utilized for tamper detection. U.S. Patent Application Publication No. 2008/0129501 by Tucker et al. is incorporated herein by reference in its entirety. Sensors 53A, 53B may have the same configuration as one another in some examples, or may have different configurations in other examples.

In the example illustrated in FIG. 4, sensor layers 53A and 53B are electrically coupled to electrically conductive vias 32 within stack 54 via electrical contacts 62 and 64, respectively. In this way, IC layers 56A and 56C, interposer portion 60, IC die 58A-58C, and/or another component of system 52 electrically coupled to the electrically conductive vias 32 may detect potential tampering based on the electrical properties of sensor layers 53A and 53B. For example, as described above, one or more of IC die 58A-58C may include a processor die that is configured to analyze the data generated by sensor layers 53A and 53B and determine whether the data indicates that a potential tamper event has occurred, e.g., whether a change in an electrical property in one sensor layers 53A and 53B has occurred.

In some examples, sensor layers 53A and 53B may be passive thin film sensors, such as strain or stress gauges. For example, passive sensor layers 53A and 53B may generate a change in a parameter (e.g., an electrical parameter such as resistance, or an optical parameter such as the wavelength of light) based on potential tampering, but may not themselves determine that potential tampering has occurred based on the change. In these examples, another component of system 52, such as a processing IC die or an IC layer that includes processing capabilities, may analyze the generated change in the parameter and determine, based on the analysis, that potential tampering has occurred. In other examples, sensor layers 53A and 53B may be active thin film sensors. In these examples, active sensor layers 53A and 53B may generate the parameter change and, in addition, may themselves have processing capabilities configured to determine that the parameter change indicates a potential tampering event.

In some examples, sensor layers 53A, 53B may each be configured to detect tampering with system 52, such that sensor layers 53A, 53B are configured to operate independently to detect tampering. In other examples, sensor layers 53A, 53B may cooperate to detect tampering with system 52, such that the tamper sensor of system 52 is split between two layers 53A, 53B and the function of the tamper sensor is divided between layers 53A, 53B. As an example, one sensor layer 53A may be a passive thin film sensor and the other sensor layer 53B (e.g., incorporated into an IC layer 56A and 56C) may include circuitry configured to monitor the parameter generated by sensor layer 53A and detect a change in the parameter generated by sensor layer 53A in response to attempted tampering (e.g., cutting of the sensor layer 53A or other disruption to sensor layer 53A).

In some examples, in response to detecting a tamper event based on a change in a property of one or both sensor layers 53A, 53B, one or more components of system 52 may take an action, e.g., to prevent reverse engineering of system 52. For example, in examples in which IC die 58A-58C include processing capabilities to analyze data generated by sensor layers 53A and 53B, IC die 58A-58C may sanitize or otherwise render unintelligible data (e.g., erasing an encryption key, such as a secret encryption key) stored by IC die 58A-58C or in other components of system 52 in response to detecting a potential tamper event. In another example, a component of system 52, such as one of IC die 58A-58C, may self-destruct a part of system 52 in response to detecting a tamper event. As another example, a component of system 52, such as one of IC die 58A-58C, may send an alert to a user or owner of the system 52 that indicates that a potential tamper event has occurred. In some examples, if any of layers 56A-56C of system 52 have been separated from one another (e.g., in a potential tamper event), electrical signals may not be transmitted through system 52, preventing normal functioning of circuitry within system 52, which may provide additional security against a potential reverse engineering attempt.

Stacked IC systems 22, 52 described herein may be incorporated into a larger system using any suitable technique. In some examples, the IC systems 20, 52 may each be incorporated into an IC package, which may provide protection of the IC systems contained therein against environmental contaminants. In addition, the IC package may provide a thermally conductive pathway for dissipating heat generated by the enclosed one or more IC systems 20, 52. In some examples, the IC packages may also facilitate mounting of the IC system 20, 52 onto a printed board.

Figure 5A:
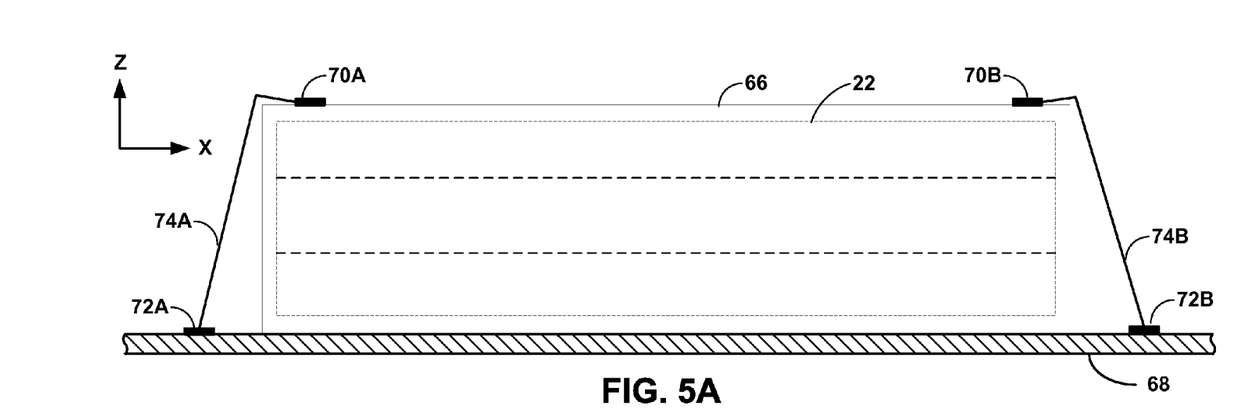
FIGS. 5A and 5B are schematic cross-sectional diagrams illustrating example vertically-stacked integrated circuit systems electrically coupled to printed boards.
Figure 5B:
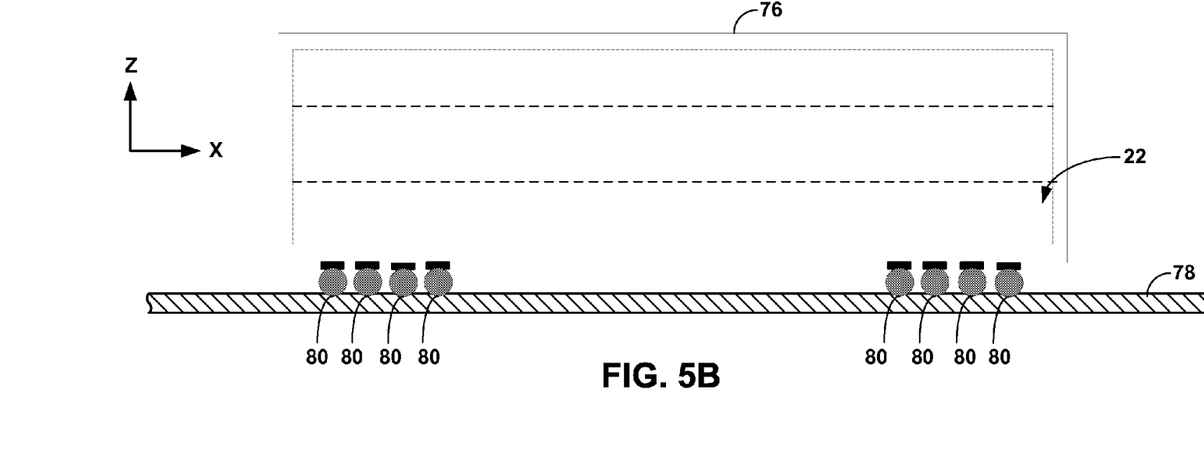

FIGS. 5A and 5B are schematic cross-sectional diagrams illustrating stack 22 (FIG. 2) housed in IC package 66 and IC package 76, respectively, and electrically coupled to printed boards 68 and 78, respectively, via the respective packages 66, 76. In some examples, packages 66, 76 are each configured to provide a hermetic housing for IC stack 22, which may be useful in some applications to help protect IC system 20 from environmental contaminants. In the example illustrated in FIG. 5A, electrical contacts 70A and 7B of package 66 are coupled to electrical contacts 72A and 72B, respectively, of printed board 68 via electrical leads 74A and 74B, respectively. In the example illustrated in FIG. 5B, IC package 76 is electrically coupled to printed board 78 via solder balls 80. In other examples, the stacked IC systems may be coupled to a printed board via another suitable technique, such as via conductive pins, solder columns, and the like.

Stack 22 may be packaged in any suitable manner using any suitable packaging technique known in the art. For example, the packages 66 and 76 may comprise an electrically conductive material such as aluminum silicon carbide (AlSiC), copper tungsten (CuW), copper molybdenum (CuMo), a nickel cobalt ferrous alloy (e.g., an alloy provided under the trademark Kovar®, made available by Carpenter Technology Corporation of Reading Pa.), or the like. As another example, packages 68 and 78 may include an electrically insulating ceramic material, such as aluminum oxide, aluminum nitride (AlN), beryllium oxide (BeO), and silicon carbide (SiC). In some examples, packages 68 and 78 may also include materials that are thermally conductive. As another example, packages 68 and 78 may include a polymeric material, such as a polytetrafluoroethylene (PTFE)/ceramic based laminate (e.g., Rogers RO2800 laminate, which is made commercially available by Rogers Corporation of Rogers, Conn.) or fluoropolymer materials (e.g., fluoropolymers made commercially available by W.L. Gore and Associates of Newark, Del.), FR-4, BT-Epoxy, or polyimide.

Input/output connections to stack 22 (e.g., to IC die within stack 22) may be made through an IC layer (e.g., one or both IC layers 26A, 26C) or through a sensor layer that is coupled to the IC layer (e.g., one or both sensor layers 58A, 58B). In the example illustrated in FIG. 5A, package 66 includes electrical contacts 70A and 70B positioned on an outer surface of package 66. The electrical contacts 70A and 70B may be electrically coupled to one or more of the electrically conductive vias extending through IC layers 26A-26C of stack 22. In this way, the electrically conductive vias of stack 22 may be electrically coupled to the printed board 68.

In the example illustrated in FIG. 5A, electrical contacts 70A and 70B are positioned on a top surface of package 66. In other examples, electrical contacts 70A and 70B may be positioned on another surface of package 66, e.g., a side surface or bottom surface, or may be entirely embedded within package 66. In some examples, package 66 may include less than two, e.g., one, or more than two, e.g., three or four, electrical contacts.

In the example illustrated in FIG. 5A, printed board 68 includes electrical contacts 72A and 72B configured to be electrically coupled to electrical contacts 70A and 70B of package 66 via electrical leads 74A and 74B, respectively. Electrical leads 74A and 74B can be any suitable electrically conductive lead. Electrical leads 74A and 74B provide an electrically conductive pathway between respective electrical contacts 70A and 70B, e.g., braze pads, on package 66 and electrical contacts 72A and 72B on printed board 68.

In the example illustrated in FIG. 5B, package 76 (which houses stack 22) is electrically and mechanically coupled to printed board 78 via a plurality of solder balls 80 at the bottom of package 76. Solder balls 80 form an electrically conductive pathway between electrically conductive vias of IC layers 26A-26C of stack 22 and electrical contacts on printed board 78. In this way, solder balls 80 electrically connect stack IC layers 26A-26C of stack 22 to printed board 78.

In other examples, electrically conductive vias of stack 22 may be electrically coupled to electrical contacts of the printed board via another mechanism, such as solder columns or electrically conductive pins, which can be distributed along a bottom surface of package 66 or 76, as shown in FIG. 5B with respect to solder balls 80.

Figure 6:
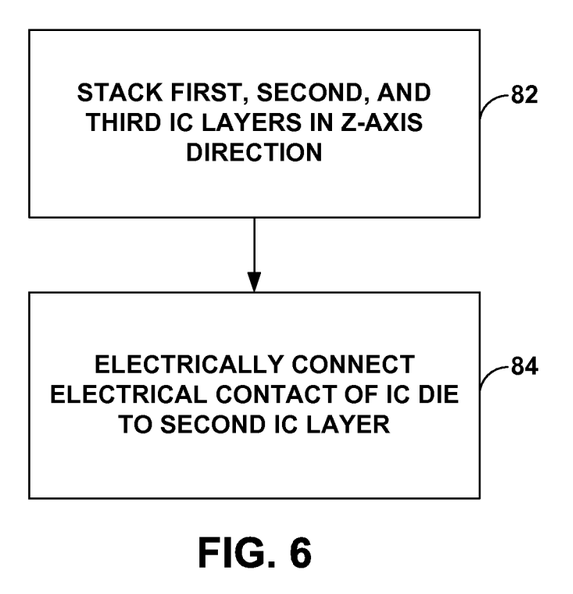
FIG. 6 is a flow diagram illustrating an example technique for forming the system illustrated in FIG. 2.

FIG. 6 is a flow diagram illustrating an example technique that may be used to form a stacked IC system, such as system 20 (FIG. 2) or system 52 (FIG. 4). While the technique shown in FIG. 6 is described with respect to system 20, in other examples, the technique may be used to form other stacked IC systems that include a plurality of IC layers including an IC layer with an interposer portion and IC dice. The technique described with respect to FIG. 6 may be performed manually (e.g., by one or more users) and/or automatically (e.g., by one or more manufacturing devices under the control of a control system including a processor).

According to the technique illustrated in FIG. 6, IC layer 26A, IC layer 26B, and IC layer 26C are stacked in a substantially z-axis direction (82). During stacking, the layers may be electrically and mechanically coupled to one another using any suitable technique. For example, adhesive bonding may be utilized to mechanically couple one or more components of the layers to one another. As described above, in some examples, the IC die 28A-28C may be bonded to IC layer 26A using an adhesive bond 50 to maintain IC die 28A-28C at a particular position within stack 22. IC layers 26A-26C may also be mechanically and electrically coupled to one another via metal bonding, in some examples. For example, electrically conductive vias of adjacent IC layers may be electrically connected via electrical contacts (e.g., contacts 42 and 44, or contacts 46 and 48) positioned between vias of adjacent layers and metal bonded to one another.

The technique illustrated in FIG. 6 additionally includes electrically connecting an electrical contact 36 of one or more of IC die 28A-28C to IC layer 26C (84). For example, in some examples, an electrical contact 38 positioned on a surface of IC layer 26C. In this way, the IC die 28A-28C may be in electrical communication with IC layer 26C, interposer portion 30, and IC layer 26A, which may all be connected by electrically conductive vias extending through the respective layer. In accordance with the configuration of system 20, as described above, when electrical contact 36 of, e.g., IC die 28A is electrically connected to electrical contact 38 of IC layer 26C, vias of the interposer portion 30 electrically connect IC die 28A with IC layer 26A. Electrically connecting IC die 28A-28C to IC layer 26C may facilitate integration of IC die 28A-28C into stack 22, even though IC die 28A-28C may not include through-silicon vias extending therethrough.

Various examples have been described. These and other examples are within the scope of the following claims.

What is claimed is:

1. A system comprising:
   a first integrated circuit layer comprising a first plurality of interconnect elements;
   a second integrated circuit layer comprising a second plurality of interconnect elements, wherein the second integrated circuit layer is a semiconductor device that comprises the second plurality of interconnect elements;
   a third integrated circuit layer positioned between the first and second integrated circuit layers, wherein the first, second, and third integrated circuit layers are stacked in a z-axis direction, and wherein the third integrated circuit layer comprises:
   an interposer portion comprising an electrically conductive through-via, wherein the electrically conductive through-via is configured to communicate with at least one interconnect element of the first plurality of interconnect elements and at least one interconnect element of the second plurality of interconnect elements, and
   an integrated circuit die adjacent to the interposer portion and between the first and second integrated circuit layers, wherein a surface of the integrated circuit die comprises an electrical contact electrically connected to the second integrated circuit layer, wherein the electrically conductive through-via of the interposer portion electrically connects the integrated circuit die with the first integrated circuit layer; and
   an integrated circuit package that houses the first integrated circuit layer, the second integrated circuit layer, and the third integrated circuit layer.

2. The system of claim 1, wherein the integrated circuit die does not include an electrically conductive through-via electrically connected to the first integrated circuit layer.

3. The system of claim 1, wherein the interposer portion is integral with at least one of the first integrated circuit layer or the second integrated circuit layer.

4. The system of claim 1, further comprising a sensor layer coupled to an outer surface of at least one of the first integrated circuit layer or the second integrated circuit layer, wherein a characteristic of the sensor layer is configured to change in response to a tamper event.

5. The system of claim 4, wherein the characteristic comprises at least one of a resistance, a capacitance, an inductance, a chemical characteristic, a magnetic characteristic, an acoustic characteristic, a pressure characteristic, a vibration characteristic, a thermal characteristic, or an optical characteristic.

6. The system of claim 4, wherein the integrated circuit die comprises a processor configured to monitor the characteristic of the sensor layer and detect the tamper event based on monitoring the characteristic.

7. The system of claim 1, wherein at least one of the first integrated circuit layer, the second integrated circuit layer, or the interposer portion is configured to provide electromagnetic interference shielding of the integrated circuit die.

8. The system of claim 1, wherein at least one of the first integrated circuit layer or the second integrated circuit layer is configured to dissipate heat generated by the integrated circuit die.

9. The system of claim 1, further comprising an adhesive bond positioned between the integrated circuit die and the first layer.

10. The system of claim 1, wherein the electrically conductive through-via of the interposer portion comprises a first electrically conductive through-via of the interposer portion and the integrated circuit die comprises a first integrated circuit die, wherein the interposer portion further comprises a second electrically conductive through-via configured to communicate with at least one interconnect element of the first plurality of interconnect elements and at least one interconnect element of the second plurality of interconnect elements, and wherein the third integrated circuit layer further comprises a second integrated circuit die adjacent to the interposer portion and between the first and second integrated circuit layers, wherein a surface of the second integrated circuit die comprises an electrical contact electrically connected to the second integrated circuit layer, wherein the second electrically conductive through-via electrically connects the second integrated circuit die with the first integrated circuit layer.

11. A method comprising:
stacking a first integrated circuit layer, a second integrated circuit layer, and a third integrated circuit layer in a z-axis direction, wherein:
the first integrated circuit layer comprises a first plurality of interconnect elements,
the second integrated circuit layer comprises a second plurality of interconnect elements, wherein the second integrated circuit layer is a semiconductor device that comprises the second plurality of interconnect elements, and
the third integrated circuit layer comprises:
an interposer portion comprising an electrically conductive through-via configured to communicate with at least one interconnect element of the first plurality of interconnect elements and at least one interconnect element of the second plurality of interconnect elements, and
an integrated circuit die adjacent to the interposer portion and between the first and second integrated circuit layers, wherein a surface of the integrated circuit die comprises an electrical contact;
electrically connecting the electrical contact of the integrated circuit die to the second integrated circuit layer; and
positioning the first integrated circuit layer, the second integrated layer, and the third integrated layer within an integrated circuit package,
wherein, when the electrical contact of the integrated circuit die is electrically connected to the second integrated circuit layer, the electrically conductive through-via of the interposer portion electrically connects the integrated circuit die with the first integrated circuit layer.

12. The method of claim 11, wherein the integrated circuit die does not include a through-via electrically connected to the first integrated circuit layer.

13. The method of claim 11, further comprising
coupling a sensor layer to an outer surface of at least one of the first integrated circuit layer or the second integrated circuit layer, wherein a characteristic of the sensor layer is configured to change in response to a tamper event, wherein the integrated circuit die comprises a processor configured to monitor the characteristic of the sensor layer and detect the tamper event based on monitoring the characteristic.

14. The method of claim 11, wherein the electrically conductive through-via of the interposer portion comprises a first electrically conductive through-via of the interposer portion and the integrated circuit die comprises a first integrated circuit die, wherein the interposer portion comprises a second electrically conductive through-via configured to communicate with at least one interconnect element of the first plurality of interconnect elements and at least one interconnect element of the second plurality of interconnect elements, wherein the third integrated circuit layer further comprises a second integrated circuit die adjacent to the interposer portion and between the first and second integrated circuit layers and comprising an electrical contact, the method further comprising electrically connecting the electrical contact of the second integrated circuit die to the second integrated circuit layer,
wherein, when the electrical contact of the second integrated circuit die is electrically connected to the second integrated circuit layer, the second electrically conductive through-via of the interposer portion electrically connects the second integrated circuit die with the first integrated circuit layer.

15. The system of claim 1, wherein the semiconductor device comprises a semiconductor component.

16. The system of claim 15, wherein the semiconductor component comprises a transistor.

17. The system of claim 1, wherein at least one of the first integrated circuit layer, the second integrated circuit layer, or the interposer portion comprises interconnect elements configured to at least one of condition or process electrical signals.

18. The system of claim 1, wherein the second integrated circuit layer further comprises a silicon substrate, and wherein the second plurality of interconnect elements are formed within the silicon substrate.

19. A system comprising:
a first integrated circuit layer comprising a first plurality of interconnect elements;
a second integrated circuit layer comprising a second plurality of interconnect elements and a silicon substrate, wherein the second integrated circuit layer is a semiconductor device that comprises the second plurality of interconnect elements, and wherein the second plurality of interconnect elements are formed within the silicon substrate; and
a third integrated circuit layer positioned between the first and second integrated circuit layers, wherein the first, second, and third integrated circuit layers are stacked in a z-axis direction, and wherein the third integrated circuit layer comprises:
an interposer portion comprising an electrically conductive through-via, wherein the electrically conductive through-via is configured to communicate with at least one interconnect element of the first plurality of interconnect elements and at least one interconnect element of the second plurality of interconnect elements, and an integrated circuit die adjacent to the interposer portion and between the first and second integrated circuit layers, wherein a surface of the integrated circuit die comprises an electrical contact electrically connected to the second integrated circuit layer, wherein the electrically conductive through-via of the interposer portion electrically connects the integrated circuit die with the first integrated circuit layer.

* * * * *